United States Patent
Sugiyama et al.

(10) Patent No.: US 11,735,781 B2
(45) Date of Patent: Aug. 22, 2023

(54) CHARGE AND DISCHARGE CONTROL DEVICE, CHARGE AND DISCHARGE SYSTEM, CHARGE AND DISCHARGE CONTROL METHOD, AND NON-TRANSITORY STORAGE MEDIUM

(71) Applicant: KABUSHIKI KAISHA TOSHIBA, Tokyo (JP)

(72) Inventors: Nobukatsu Sugiyama, Kawasaki Kanagawa (JP); Yumi Fujita, Tokyo (JP); Tomokazu Morita, Funabashi Chiba (JP); Ena Ishii, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 151 days.

(21) Appl. No.: 17/007,192

(22) Filed: Aug. 31, 2020

(65) Prior Publication Data

US 2021/0226266 A1    Jul. 22, 2021

(30) Foreign Application Priority Data

Jan. 17, 2020    (JP) .................................. 2020-005970

(51) Int. Cl.
*H02J 7/00* (2006.01)
*G01R 31/382* (2019.01)
(Continued)

(52) U.S. Cl.
CPC ........ *H01M 10/441* (2013.01); *G01R 31/367* (2019.01); *G01R 31/382* (2019.01);
(Continued)

(58) Field of Classification Search
CPC . H01M 10/441; G01R 31/367; G01R 31/382; G01R 31/3842; H02J 7/00304;
(Continued)

(56) References Cited

U.S. PATENT DOCUMENTS 4,006,396 A * 2/1977 Bogut ............... H02J 7/007194
                                                        320/112
4,238,721 A * 12/1980 DeLuca ................ H02J 7/0016
                                                        320/122
(Continued)

FOREIGN PATENT DOCUMENTS

EP    2 590 297 A2    5/2013
EP    3 413 391 A1    12/2018
(Continued)

OTHER PUBLICATIONS

K. Kim et al., "Three-Dimensional Adhesion Map Based on Surface and Interfacial Cutting Analysis System for Predicting Adhesion Properties of Composite Electrodes," ACS Applied Materials & Interfaces, vol. 8, pp. 23688-23695 (2016).
(Continued)

*Primary Examiner* — John T Trischler
(74) *Attorney, Agent, or Firm* — Finnegan, Henderson, Farabow, Garrett & Dunner, LLP

(57) ABSTRACT

A charge and discharge control device that controls charging and discharging of a battery module in which a plurality of cell blocks, each including one or more unit cells, are connected in parallel to one another. A controller of the charge and discharge control device controls a current flowing through each of the cell blocks based on at least one of a current load of each of the cell blocks or a parameter relating to the current load.

3 Claims, 8 Drawing Sheets

(51) Int. Cl.
*H01M 10/44* (2006.01)
*G01R 31/3842* (2019.01)
*G01R 31/367* (2019.01)
*G01R 31/396* (2019.01)

(52) U.S. Cl.
CPC ........ *G01R 31/3842* (2019.01); *H02J 7/0048* (2020.01); *H02J 7/00304* (2020.01); *H02J 7/00714* (2020.01); *H02J 7/007182* (2020.01); *H02J 7/007184* (2020.01); *G01R 31/396* (2019.01); *Y02T 10/7072* (2013.01)

(58) Field of Classification Search
CPC ................ H02J 7/0048; H02J 7/00714; H02J 7/007182; H02J 7/007184
USPC ........................................................ 320/137
See application file for complete search history.

(56) References Cited

U.S. PATENT DOCUMENTS

| | | | | |
|---|---|---|---|---|
| 5,115,182 A * | 5/1992 | Ehmke | H02J 7/00 | 320/136 |
| 5,557,189 A * | 9/1996 | Suzuki | H02J 7/0016 | 320/DIG. 22 |
| 5,656,920 A * | 8/1997 | Cherng | B60L 58/22 | 320/161 |
| 5,780,991 A * | 7/1998 | Brake | H02J 7/00038 | 320/120 |
| 5,825,155 A * | 10/1998 | Ito | H02J 7/0024 | 429/149 |
| 6,388,447 B1 * | 5/2002 | Hall | H02J 7/007184 | 324/426 |
| 6,403,253 B1 | 6/2002 | Wainwright et al. | | |
| 6,822,425 B2 * | 11/2004 | Krieger | H02J 7/007 | 320/137 |
| 7,253,588 B2 * | 8/2007 | Satoh | H01M 10/486 | 320/136 |
| 7,501,797 B2 * | 3/2009 | Satoh | H02J 7/0031 | 320/136 |
| 7,564,223 B2 * | 7/2009 | Krieger | H02J 7/00 | 324/426 |
| 7,656,118 B2 * | 2/2010 | Krieger | H02J 7/0034 | 320/105 |
| 7,675,263 B2 * | 3/2010 | Kawasumi | H01M 50/583 | 429/96 |
| 7,777,452 B2 * | 8/2010 | Nishiyama | H01M 10/44 | 320/129 |
| 8,179,650 B2 * | 5/2012 | Watanabe | H01M 10/482 | 361/93.1 |
| 8,207,740 B2 * | 6/2012 | Lin | H01M 10/441 | 320/119 |
| 8,212,398 B2 * | 7/2012 | Kishimoto | H02J 7/0025 | 307/43 |
| 8,368,345 B2 * | 2/2013 | Wahlqvist | H02J 7/007182 | 320/101 |
| 8,374,807 B2 * | 2/2013 | Hall | G01R 31/3842 | 702/63 |
| 8,384,351 B2 * | 2/2013 | Monden | H02J 7/00304 | 320/120 |
| 8,478,452 B2 * | 7/2013 | Pratt | G05B 13/02 | 700/297 |
| 8,583,311 B2 * | 11/2013 | Takao | B60M 3/02 | 257/730 |
| 8,593,111 B2 * | 11/2013 | Tatebayashi | H02J 7/0013 | 320/128 |
| 8,700,225 B2 * | 4/2014 | Pratt | B60L 58/13 | 700/297 |
| 8,975,897 B2 * | 3/2015 | Yoshioka | G01R 31/389 | 324/426 |
| 9,093,847 B2 * | 7/2015 | Hoff | H02J 7/007194 | |
| 9,118,191 B2 * | 8/2015 | Jung | H02J 7/0016 | |
| 9,153,846 B2 * | 10/2015 | Liang | H02J 7/0091 | |
| 9,184,692 B2 * | 11/2015 | Schmidt | B60L 50/64 | |
| 9,187,000 B2 * | 11/2015 | Kuwano | B60L 53/14 | |
| 9,213,070 B2 * | 12/2015 | Hoshino | G01R 31/367 | |
| 9,312,717 B2 * | 4/2016 | Nogi | B60L 58/18 | |
| 9,356,469 B2 * | 5/2016 | Kuroda | H02J 9/00 | |
| 9,368,979 B2 * | 6/2016 | Gong | H02J 7/0014 | |
| 9,385,545 B2 * | 7/2016 | Nakamoto | B60L 53/00 | |
| 9,496,723 B2 * | 11/2016 | Gong | H02J 7/0014 | |
| 9,525,290 B2 * | 12/2016 | Snyder | H02J 7/0016 | |
| 9,553,468 B2 * | 1/2017 | Bhardwaj | H02J 7/007192 | |
| 9,566,865 B2 * | 2/2017 | Kim | H02J 7/0048 | |
| 9,577,443 B2 * | 2/2017 | Gach | G01R 31/382 | |
| 9,685,796 B2 * | 6/2017 | Poirier | B60L 58/22 | |
| 9,685,799 B2 * | 6/2017 | Kaji | H02J 3/241 | |
| 9,753,440 B2 * | 9/2017 | Pratt | B60L 58/13 | |
| 9,929,573 B2 * | 3/2018 | Gong | H02J 7/0016 | |
| 9,948,228 B2 * | 4/2018 | Usuda | H02J 7/0077 | |
| 9,985,448 B2 * | 5/2018 | Nakamoto | B60L 53/00 | |
| 10,027,134 B2 * | 7/2018 | Mei | H02J 7/0021 | |
| 10,036,781 B2 * | 7/2018 | Vinassa | G01R 31/367 | |
| 10,079,390 B2 * | 9/2018 | Matsuno | H01M 4/667 | |
| 10,109,841 B2 * | 10/2018 | Kobayashi | H02J 7/0026 | |
| 10,135,282 B2 * | 11/2018 | Ohashi | H02J 3/32 | |
| 10,193,344 B2 * | 1/2019 | Sekita | H02J 7/0031 | |
| 10,270,264 B2 * | 4/2019 | Yoon | H02J 7/0042 | |
| 10,283,820 B2 * | 5/2019 | Sugeno | H02J 7/00 | |
| 10,291,038 B2 * | 5/2019 | Mei | H02J 7/0048 | |
| 10,302,707 B2 * | 5/2019 | Gach | G01R 31/367 | |
| 10,338,152 B2 * | 7/2019 | Ide | G01R 31/396 | |
| 10,355,320 B2 * | 7/2019 | Fujita | H02J 7/007 | |
| 10,381,845 B2 * | 8/2019 | Nakamoto | H02J 7/1461 | |
| 10,461,370 B2 * | 10/2019 | Hotta | H01M 10/4235 | |
| 10,461,375 B2 * | 10/2019 | Yoshima | H01M 4/02 | |
| 10,505,375 B2 * | 12/2019 | Bryngelsson | H02J 7/00712 | |
| 10,523,022 B2 * | 12/2019 | Yen | H01M 10/425 | |
| 10,581,238 B2 * | 3/2020 | Okabe | H02H 7/18 | |
| 10,608,444 B2 * | 3/2020 | Kaneko | H01M 10/448 | |
| 10,663,932 B2 * | 5/2020 | Pratt | H02J 3/241 | |
| 10,673,103 B2 * | 6/2020 | Hoshina | H01M 4/505 | |
| 10,720,667 B2 * | 7/2020 | Takami | H01M 10/0562 | |
| 10,727,540 B2 * | 7/2020 | Takami | H01M 50/20 | |
| 10,756,392 B2 * | 8/2020 | Seki | H01M 10/38 | |
| 10,862,092 B2 * | 12/2020 | Yoshima | H01M 50/431 | |
| 10,871,522 B2 * | 12/2020 | Ishii | G01R 31/3648 | |
| 11,043,821 B2 * | 6/2021 | Nishikawa | H02J 7/02 | |
| 11,095,143 B2 * | 8/2021 | Akaishi | B60L 3/0092 | |
| 11,142,078 B2 * | 10/2021 | Marino | B60L 50/61 | |
| 11,191,964 B2 * | 12/2021 | Wilder | A61N 1/36128 | |
| 11,205,905 B2 * | 12/2021 | Park | H02J 7/0029 | |
| 11,223,212 B2 * | 1/2022 | Akaishi | H02J 7/0014 | |
| 11,289,918 B2 * | 3/2022 | Troxel | H01M 10/48 | |
| 11,394,222 B2 * | 7/2022 | Sugiyama | H01M 4/364 | |
| 11,437,659 B2 * | 9/2022 | Sun | H01M 10/482 | |
| 2001/0017237 A1 * | 8/2001 | Tominaga | H02P 23/06 | 187/290 |
| 2003/0141845 A1 * | 7/2003 | Krieger | H02J 7/342 | 320/132 |
| 2004/0130298 A1 * | 7/2004 | Krieger | H02J 7/0034 | 320/165 |
| 2005/0017681 A1 * | 1/2005 | Ogishima | A47L 9/2805 | 320/112 |
| 2005/0237686 A1 * | 10/2005 | Satoh | H01M 10/443 | 361/92 |
| 2005/0266299 A1 * | 12/2005 | Nishiyama | H01M 10/44 | 429/61 |
| 2006/0001401 A1 * | 1/2006 | Krieger | H02J 7/342 | 320/128 |
| 2006/0103348 A1 * | 5/2006 | Melichar | H01M 10/48 | 320/116 |
| 2006/0186857 A1 * | 8/2006 | Matty | H01M 10/46 | 320/112 |
| 2007/0212596 A1 * | 9/2007 | Nebrigic | H01M 10/42 | 429/61 |
| 2007/0231680 A1 * | 10/2007 | Satoh | H01M 10/443 | 429/122 |
| 2008/0048619 A1 * | 2/2008 | Yoshida | B60L 3/12 | 320/134 |

(56) References Cited

U.S. PATENT DOCUMENTS

| | | | |
|---|---|---|---|
| 2008/0185996 A1* | 8/2008 | Krieger | H02J 7/007 320/139 |
| 2008/0203967 A1* | 8/2008 | Krieger | H02J 7/0034 340/384.1 |
| 2008/0285193 A1* | 11/2008 | Watanabe | H01M 10/482 361/88 |
| 2009/0107743 A1* | 4/2009 | Alston | B60H 1/00428 903/906 |
| 2009/0123813 A1* | 5/2009 | Chiang | H01M 10/44 429/231.95 |
| 2009/0229288 A1* | 9/2009 | Alston | B60H 1/00428 62/239 |
| 2010/0072950 A1* | 3/2010 | Tatebayashi | H02J 7/0031 320/134 |
| 2010/0079108 A1* | 4/2010 | Monden | H02J 7/0014 320/134 |
| 2010/0121591 A1* | 5/2010 | Hall | G01R 31/367 702/63 |
| 2010/0201323 A1* | 8/2010 | Okamura | H02J 7/0031 320/134 |
| 2010/0321025 A1* | 12/2010 | Lin | H01M 10/4207 324/427 |
| 2011/0148342 A1* | 6/2011 | Wahlqvist | H02J 7/0031 320/101 |
| 2011/0148361 A1* | 6/2011 | Yokotani | H01M 10/482 320/136 |
| 2011/0221394 A1* | 9/2011 | Shigemizu | H02J 7/0018 320/118 |
| 2011/0245987 A1* | 10/2011 | Pratt | B60L 53/51 320/132 |
| 2012/0038320 A1* | 2/2012 | Kabasawa | H02J 7/0019 320/112 |
| 2012/0133331 A1* | 5/2012 | Ling | G01R 31/367 320/132 |
| 2012/0200160 A1* | 8/2012 | Pratt | B60L 53/68 307/48 |
| 2012/0310566 A1* | 12/2012 | Hoshino | G01R 31/367 702/63 |
| 2013/0009602 A1* | 1/2013 | Hoff | H02J 7/0024 320/126 |
| 2013/0027047 A1* | 1/2013 | Yoshioka | G01R 31/389 324/426 |
| 2013/0049698 A1* | 2/2013 | Jung | H02J 7/007184 320/134 |
| 2013/0106354 A1* | 5/2013 | Suzuki | H02J 7/0016 320/116 |
| 2013/0127423 A1* | 5/2013 | Liang | H02J 7/007192 429/153 |
| 2013/0200824 A1* | 8/2013 | Schmidt | H01M 10/441 318/139 |
| 2013/0268132 A1* | 10/2013 | Pratt | B60L 53/56 700/286 |
| 2013/0335026 A1* | 12/2013 | Reynolds | H02J 7/0016 320/112 |
| 2014/0070770 A1* | 3/2014 | Nogi | B60L 9/04 320/167 |
| 2014/0077731 A1* | 3/2014 | Kuwano | B60L 53/14 320/126 |
| 2014/0203765 A1* | 7/2014 | Kuroda | H02J 9/00 320/107 |
| 2014/0239964 A1* | 8/2014 | Gach | H02J 7/0013 324/433 |
| 2014/0266072 A1* | 9/2014 | Gong | H02J 7/0016 320/164 |
| 2014/0320070 A1* | 10/2014 | Nakamoto | H02J 7/0034 320/136 |
| 2014/0365150 A1* | 12/2014 | Hahn | G01R 31/3842 702/63 |
| 2015/0115736 A1* | 4/2015 | Snyder | H02J 7/0048 307/115 |
| 2015/0120109 A1* | 4/2015 | Cun | B60L 53/305 320/137 |
| 2015/0160300 A1 | 6/2015 | Ishii et al. | |
| 2015/0231979 A1* | 8/2015 | Dashko | B60L 15/007 320/162 |
| 2015/0340888 A1* | 11/2015 | Hofer | G01N 7/00 374/143 |
| 2015/0346283 A1* | 12/2015 | Kwon | H01M 10/48 702/63 |
| 2016/0006272 A1* | 1/2016 | Greening | H02J 7/00047 320/162 |
| 2016/0025814 A1* | 1/2016 | Ide | G01R 31/396 324/432 |
| 2016/0031324 A1* | 2/2016 | Kim | H02J 7/00 701/34.4 |
| 2016/0049821 A1 | 2/2016 | Aridome | |
| 2016/0079777 A1* | 3/2016 | Bhardwaj | H02J 7/00 320/153 |
| 2016/0137092 A1* | 5/2016 | Thieme | B60W 10/08 307/10.6 |
| 2016/0190829 A1* | 6/2016 | Mei | H01M 10/441 320/112 |
| 2016/0233696 A1* | 8/2016 | Mei | H02J 7/0021 |
| 2016/0233698 A1* | 8/2016 | Gong | H02J 7/0016 |
| 2016/0245876 A1* | 8/2016 | Vinassa | H02J 7/00 |
| 2016/0285291 A1* | 9/2016 | Nakamoto | B60L 58/15 |
| 2016/0301219 A1* | 10/2016 | Desprez | H02J 7/007 |
| 2016/0344203 A1* | 11/2016 | Poirier | B60L 58/22 |
| 2016/0372928 A1* | 12/2016 | Sekita | H02J 7/35 |
| 2017/0031404 A1* | 2/2017 | Yamamoto | G06F 1/26 |
| 2017/0040808 A1* | 2/2017 | Gong | H02J 7/0016 |
| 2017/0067965 A9* | 3/2017 | Gach | H02J 7/0016 |
| 2017/0093320 A1* | 3/2017 | Usuda | H02J 7/0077 |
| 2017/0168120 A1* | 6/2017 | Gach | H02J 7/00309 |
| 2017/0187203 A1* | 6/2017 | Ikeda | G01R 31/389 |
| 2017/0214253 A1* | 7/2017 | Kim | H02J 7/0018 |
| 2017/0222272 A1* | 8/2017 | Takami | H01M 4/5825 |
| 2017/0222437 A1* | 8/2017 | Pratt | B60L 55/00 |
| 2017/0261560 A1* | 9/2017 | Goto | G01R 31/3648 |
| 2017/0264127 A1* | 9/2017 | Ohashi | H02J 7/0068 |
| 2017/0271682 A1* | 9/2017 | Matsuno | H01M 4/661 |
| 2017/0271717 A1* | 9/2017 | Yamashita | H01M 4/366 |
| 2017/0288425 A1* | 10/2017 | Fukushima | H01M 10/0525 |
| 2017/0338668 A1* | 11/2017 | Sada | H01M 10/44 |
| 2017/0365886 A1* | 12/2017 | Hoshina | H02J 7/0021 |
| 2018/0041052 A1* | 2/2018 | Nakamoto | H02J 7/0016 |
| 2018/0041054 A1* | 2/2018 | Nakamoto | H02J 7/0029 |
| 2018/0083321 A1* | 3/2018 | Hotta | H01M 4/505 |
| 2018/0102529 A1* | 4/2018 | Kobayashi | H01M 10/425 |
| 2018/0115024 A1* | 4/2018 | Sugeno | H01M 4/5825 |
| 2018/0138722 A1* | 5/2018 | Yoon | H02J 7/00 |
| 2018/0145378 A1* | 5/2018 | Fujita | H02J 7/02 |
| 2018/0191037 A1* | 7/2018 | Oh | H01M 10/441 |
| 2018/0205342 A1* | 7/2018 | Usuda | H02J 7/0016 |
| 2018/0248376 A1* | 8/2018 | Teramoto | H02J 3/38 |
| 2018/0269537 A1* | 9/2018 | Yoshima | H01M 10/4257 |
| 2018/0269538 A1* | 9/2018 | Hotta | H01M 4/485 |
| 2018/0277813 A1* | 9/2018 | Yoshima | H01M 10/24 |
| 2018/0277899 A1* | 9/2018 | Takami | H01M 4/485 |
| 2018/0321323 A1* | 11/2018 | Dubarry | G01R 31/392 |
| 2019/0081369 A1* | 3/2019 | Monden | H01M 10/482 |
| 2019/0089011 A1* | 3/2019 | Seki | B60L 58/10 |
| 2019/0089147 A1* | 3/2019 | Okabe | H02H 1/06 |
| 2019/0113581 A1* | 4/2019 | Kawamura | B60L 58/12 |
| 2019/0123567 A1* | 4/2019 | Kaneko | H01M 10/482 |
| 2019/0157883 A1* | 5/2019 | Yen | H02J 7/007182 |
| 2019/0160968 A1* | 5/2019 | Marino | B60L 50/61 |
| 2019/0160972 A1* | 5/2019 | Zeiler | A01D 69/02 |
| 2019/0195956 A1* | 6/2019 | Lim | G01R 31/367 |
| 2019/0222045 A1* | 7/2019 | Dhanapal | H02J 7/007194 |
| 2019/0288520 A1* | 9/2019 | Abdel-Monem | G01R 31/389 |
| 2019/0334355 A1* | 10/2019 | Kim | H02J 7/007194 |
| 2020/0036050 A1* | 1/2020 | Shimura | H02J 7/00304 |
| 2020/0047634 A1* | 2/2020 | Akaishi | B60L 53/62 |
| 2020/0136399 A1* | 4/2020 | Akaishi | H02J 7/0047 |
| 2020/0153255 A1* | 5/2020 | Inoue | H02J 7/0016 |
| 2020/0153263 A1* | 5/2020 | Akaishi | H02J 7/1446 |
| 2020/0161875 A1* | 5/2020 | Nishikawa | H02J 7/0048 |
| 2020/0203722 A1* | 6/2020 | Hotta | H01M 4/02 |
| 2020/0203961 A1* | 6/2020 | Flowers | H02J 7/00304 |

(56) References Cited

U.S. PATENT DOCUMENTS

| | | | |
|---|---|---|---|
| 2020/0212697 A1* | 7/2020 | Kuroda | H02J 7/0048 |
| 2020/0295584 A1* | 9/2020 | Sugiyama | H01M 10/4257 |
| 2020/0313223 A1* | 10/2020 | Roy | H01M 50/531 |
| 2020/0384888 A1* | 12/2020 | Hasan | B60L 58/12 |
| 2021/0288353 A1* | 9/2021 | Gottapu | G01R 31/382 |
| 2021/0354541 A1* | 11/2021 | Zeiler | H02J 7/0063 |
| 2021/0364575 A1* | 11/2021 | Horiuchi | H01M 10/44 |
| 2021/0384751 A1* | 12/2021 | Takahashi | H02J 7/00712 |
| 2022/0077702 A1* | 3/2022 | Shi | H02J 7/00714 |
| 2022/0077705 A1* | 3/2022 | Takahashi | B60L 58/15 |
| 2022/0085621 A1* | 3/2022 | Akaishi | H02J 7/0021 |
| 2022/0115876 A1* | 4/2022 | Wiemeyer | H02J 7/0014 |
| 2022/0123576 A1* | 4/2022 | Zhong | H02J 7/0029 |
| 2022/0255326 A1* | 8/2022 | Carlson | G06F 1/1652 |

FOREIGN PATENT DOCUMENTS

| | | | | |
|---|---|---|---|---|
| ER | 2 530 482 A1 | 12/2012 | | |
| JP | H9-508490 A | 8/1997 | | |
| JP | 2000-77073 A | 3/2000 | | |
| JP | 2001-210359 A | 8/2001 | | |
| JP | 2003-17057 A | 1/2003 | | |
| JP | 2005-071807 A | 3/2005 | | |
| JP | 2008-118790 A | 5/2008 | | |
| JP | 2010-56027 A | 3/2010 | | |
| JP | 2012-65449 A | 3/2012 | | |
| JP | 2012-251806 A | 12/2012 | | |
| JP | 2014-185896 A | 10/2014 | | |
| JP | 2014-193040 A | 10/2014 | | |
| JP | 2015-111086 A | 6/2015 | | |
| JP | 2017-99080 A | 6/2017 | | |
| JP | 2017-174809 A | 9/2017 | | |
| JP | 2017-174810 A | 9/2017 | | |
| JP | 2017-225211 A | 12/2017 | | |
| JP | 2018-45966 A | 3/2018 | | |
| JP | 2018-92955 A | 6/2018 | | |
| JP | 2018-156837 A | 10/2018 | | |
| JP | 2018-156926 A | 10/2018 | | |
| JP | 2018-160342 A | 10/2018 | | |
| JP | 2018-160443 A | 10/2018 | | |
| JP | 2018-163893 A | 10/2018 | | |
| JP | 2018-530305 A | 10/2018 | | |
| JP | 2019-57373 A | 4/2019 | | |
| JP | 2019-114324 A | 7/2019 | | |
| JP | 2020-43034 A | 3/2020 | | |
| WO | WO 2013/094743 A1 | 6/2013 | | |
| WO | WO-2018008567 A1 * | 1/2018 | ........... | H01M 10/44 |
| WO | WO 2016/185536 A1 | 2/2018 | | |
| WO | WO 2017/154115 A1 | 9/2018 | | |
| WO | WO 2018/056263 A1 | 6/2019 | | |

OTHER PUBLICATIONS

S. Liu et al., "Rechargeable Aqueous Lithium-Ion Battery of $TiO_2$/$LiMn_2O_4$ with a High Voltage," Journal of the Electrochemical Society, vol. 158, No. 12, pp. A1490-A1497 (2011).

C. Narita et al., "Study on the Appearance and Peel Strength of Byakudan-Nuri Works," Science Research, Materials Sciences and Applications, vol. 5, pp. 81-85 (2014).

B. Son et al., Measurement and Analysis of Adhesion Property of Lithium-Ion Battery Electrodes with SAICAS, ACS Applied Materials & Interfaces, vol. 6, pp. 526-531 (2014).

* cited by examiner

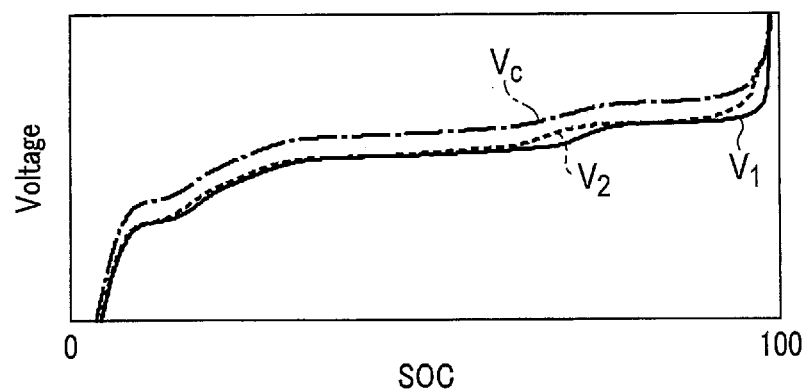
F I G. 3A
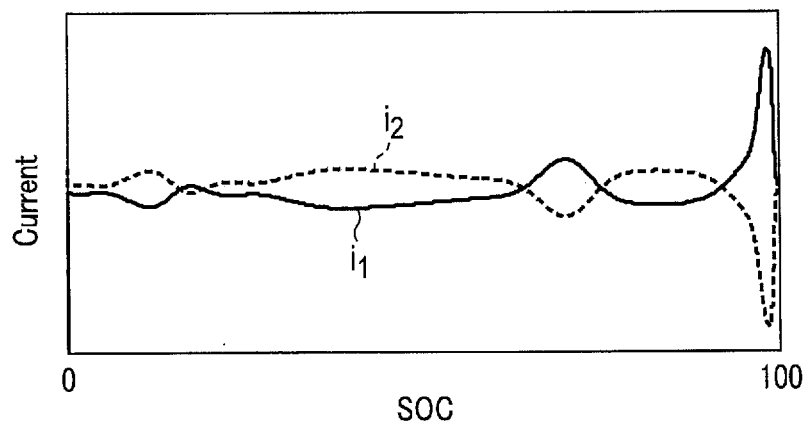
F I G. 3B
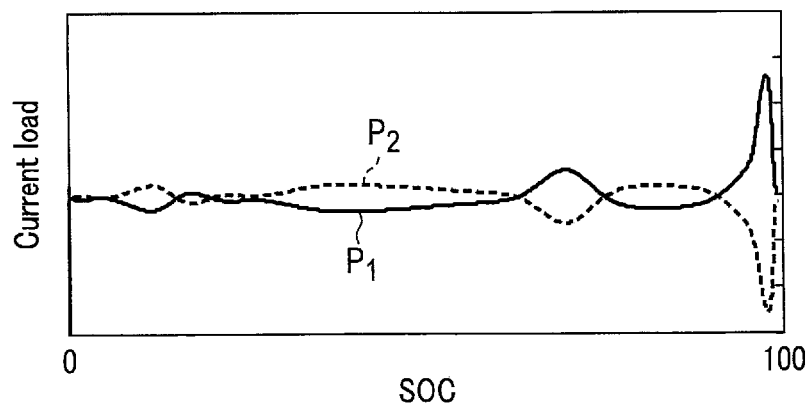
F I G. 3C

CHARGE AND DISCHARGE CONTROL DEVICE, CHARGE AND DISCHARGE SYSTEM, CHARGE AND DISCHARGE CONTROL METHOD, AND NON-TRANSITORY STORAGE MEDIUM

CROSS-REFERENCE TO RELATED APPLICATIONS

This application is based upon and claims the benefit of priority from Japanese Patent Application No. 2020-005970, filed Jan. 17, 2020; the entire contents of which are incorporated herein by reference.

FIELD

Embodiments described herein relate generally to a charge and discharge control device, a charge and discharge system, a charge and discharge control method, and a non-transitory storage medium.

BACKGROUND

As information-related apparatuses and communication apparatuses have spread, secondary batteries have widely spread as electric power supplies of the apparatuses. Secondary batteries also have been utilized in the field of electric vehicles (EV) and natural energy. In particular, lithium-ion secondary batteries are widely used, since they have a high energy density and can be downsized. In lithium-ion secondary batteries, a positive electrode active material and a negative electrode active material absorb and release lithium ions, thereby storing and releasing electric energy. When charging, the lithium ions released from the positive electrode are absorbed by the negative electrode. When discharging, the lithium ions released from the negative electrode are absorbed by the positive electrode.

In secondary batteries such as lithium-ion secondary batteries, a plurality of unit cells are electrically connected in series, so that a high voltage and a high capacity are achieved. A battery module, in which a plurality of cell blocks are electrically connected in parallel to one another, may be used as an electric power supply. In this case, each of the cell blocks includes one or more unit cells. If the cell block includes a plurality of unit cells, just a serial connection structure of a plurality of unit cells may be formed in the cell block, or both a serial connection structure and a parallel connection structure of a plurality of unit cells may be formed in the cell block.

In the battery module in which a plurality of cell blocks are connected in parallel, even if the cell blocks use the same type of unit cells and the cell blocks use the same number of unit cells and the same connection structure of the unit cells, there may be variation in the performance of the unit cells, such as in their capacity and internal resistance, between the cell blocks or there may be variation in resistance of a connecting wire between the cell blocks. Therefore, in the battery module, the cell blocks may have different performances. In addition, through repeated charging and discharging, the cell blocks may deteriorate to different degrees, and the performance may vary between the cell blocks, such as their capacity and internal resistance. In the battery module, even if the cell blocks vary in performance, it is necessary to prevent the cell blocks from excessively varying in current load and to suppress the increase in variations in deterioration between the cell blocks.

BRIEF DESCRIPTION OF THE DRAWINGS

FIG. 3A is a schematic diagram showing voltage characteristics set by calculation using a model of a battery module including two cell blocks, in which open circuit voltage characteristics of the respective cell blocks and a voltage characteristic of the battery module are illustrated.

FIG. 3B is a schematic diagram showing changes in currents flowing through the respective cell blocks relative to an SOC calculated in the calculation of FIG. 3A.

FIG. 3C is a schematic diagram showing changes in current loads of the respective cell blocks relative to an SOC calculated in the calculation of FIG. 3A.

DETAILED DESCRIPTION

According to an embodiment, there is provided a charge and discharge control device that controls charging and discharging of a battery module in which a plurality of cell blocks, each including one or more unit cells, are connected in parallel to one another. A controller of the charge and discharge control device controls a current flowing through each of the cell blocks based on at least one of a current load of each of the cell blocks or a parameter relating to the current load.

According to one embodiment, there is provided a charge and discharge control method of controlling charging and discharging of a battery module in which a plurality of cell blocks, each including one or more unit cells, are connected in parallel to one another. In the charge and discharge control method, a current flowing through each of the cell blocks is controlled based on at least one of a current load of each of the cell blocks or a parameter relating to the current load.

According to one embodiment, there is provided a non-transitory storage medium storing a charge and discharge control program to be executed by a computer for charging and discharging of a battery module in which a plurality of cell blocks, each including one or more unit cells, are connected in parallel to one another. The charge and discharge control program causes the computer to control a current flowing through each of the cell blocks based on at least one of a current load of each of the cell blocks or a parameter relating to the current load.

Embodiments will be described below with reference to the accompanying drawings.

First Embodiment

Figure 1:
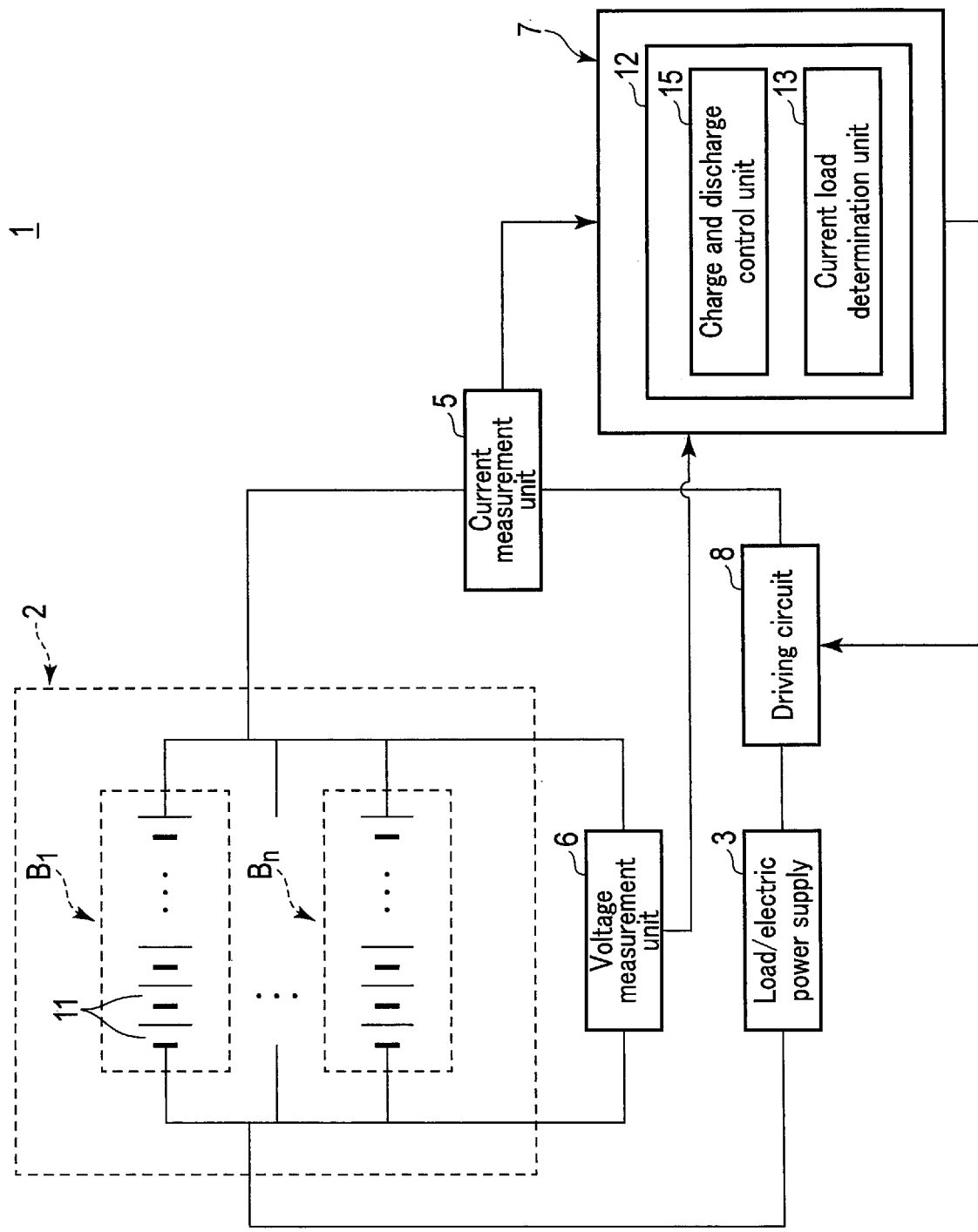
FIG. 1 is a schematic diagram showing a charge and discharge system according to a first embodiment.

FIG. 1 shows a charge and discharge system 1 according to the first embodiment. As shown in FIG. 1, the charge and discharge system 1 includes a battery module 2, a load and an electric power supply (denoted by a reference numeral 3), a current measurement unit (current measurement circuit) 5, a voltage measurement unit (voltage measurement circuit) 6, a charge and discharge control device 7, and a driving circuit 8. The battery module 2 includes a plurality of cell blocks $B_1$ to $B_n$. In the battery module 2, the cell blocks $B_1$ to $B_n$ are electrically connected to one another in parallel.

Each of the cell blocks $B_1$ to $B_n$ includes one or more unit cells 11. The unit cell 11 is, for example, a secondary battery such as a lithium-ion secondary battery. In the example shown in FIG. 1, in each of the cell blocks $B_1$ to $B_n$, the unit cells 11 are electrically connected in series, thereby forming a serial connection structure of the unit cells 11. The cell blocks $B_1$ to $B_n$ are the same in the number of unit cells 11 connected in series. In one example, any of the cell blocks $B_1$ to $B_n$ may be formed of only one unit cell 11. In another example, any of the cell blocks $B_1$ to $B_n$ may have a parallel connection structure in which the unit cells 11 are electrically connected in parallel, in addition to the serial connection structure of the unit cells 11.

The battery module 2 can be charged and discharged. The battery module 2 is charged by electric power supplied from the electric power supply. The electric power discharged from the battery module 2 is supplied to a load. The battery module 2 is mounted on an electronic apparatus, a vehicle, a stationary power supply apparatus, etc. A battery independent of the battery module 2, a generator, etc. may be the electric power supply that supplies electric power to charge the battery module 2. An electric motor, a lighting apparatus, etc. may be the load to which the electric power discharged from the battery module is supplied. In one example, an electric motor generator may function as both the electric power supply and the load. The current measurement unit 5 detects and measures a current I flowing through the battery module 2. The voltage measurement unit 6 detects and measures a voltage $V_c$ applied to the battery module 2.

The charge and discharge control device 7 includes a controller 12. The controller 12 constitutes a computer, and includes a processor and a storage medium. The processor includes one of a central processing unit (CPU), a graphics processing unit (GPU), an application specific integrated circuit (ASIC), a microcomputer, a field programmable gate array (FPGA), a digital signal processor (DSP), etc. The storage medium may include an auxiliary storage device in addition to the main storage device such as the memory. The storage medium may be a magnetic disk, an optical disk (CD-ROM, CD-R, DVD, etc.), a magneto-optical disk (MO etc.), a semiconductor memory, etc. In the controller 12, each of the processor and the storage medium may be one or more. The processor of the controller 12 executes a program etc. stored in the storage medium, thereby performing processing. The program to be executed by the processor of the controller 12 may be stored in a computer (server) connected to the processor through a network such as the Internet, or a server etc. in a cloud environment. In this case, the processor downloads the program via the network. In one example, the charge and discharge control device 7 is formed of an integrated circuit (IC) chip or the like.

The controller 12 acquires a measurement value of the current I flowing through the battery module 2 by the current measurement unit 5, and a measurement value of the voltage $V_c$ applied to the battery module 2 by the voltage measurement unit 6. The measurement of the current I by the current measurement unit 5 and the measurement of the voltage $V_c$ by the voltage measurement unit 6 are performed periodically, for example, at a predetermined timing. Thus, the controller 12 periodically acquires the measurement value of the current I and the measurement value of the voltage $V_c$ at the predetermined timing. Accordingly, the change with time (time history) of the current I and the change with time (time history) of the voltage $V_c$ are acquired by the controller 12. Furthermore, the controller 12 controls driving of the driving circuit 8, thereby controlling charging and discharging of the battery module 2. As a result, in each of the charging and discharging of the battery module 2, the current flowing through the battery module 2 is controlled.

The controller 12 also includes a current load determination unit 13 and a charge and discharge control unit 15. The current load determination unit 13 and the charge and discharge control unit 15 execute some of the processing executed by the processor or the like of the controller 12. The current load determination unit 13 performs determination about a current load of each of the cell blocks $B_1$ to $B_n$. The determination about the current load is periodically performed at a predetermined timing. The charge and discharge control unit 15 controls driving of the driving circuit 8 and controls charging and discharging of the battery module 2 based on the determination result in the current load determination unit 13.

Figure 2:
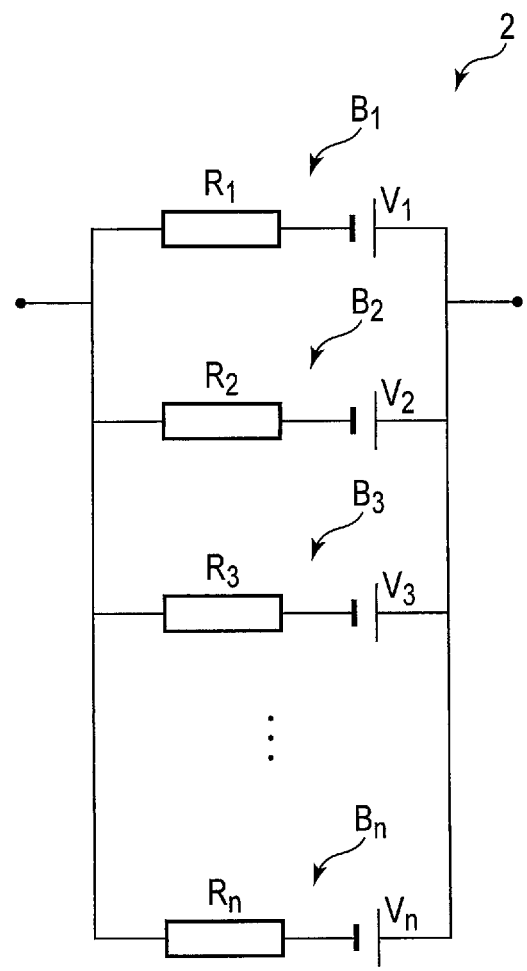
FIG. 2 is a schematic diagram showing a circuit model of a battery module of the charge and discharge system shown in FIG. 1.

FIG. 2 shows a circuit model of the battery module 2 in which n cell blocks $B_1$ to $B_n$ are connected in parallel to one another. In the model shown in FIG. 2, it is assumed that the voltage of the entire battery module 2 is $V_c$, and the current flowing through the battery module 2 is I. Furthermore, a charge amount $Q_k$ of a cell block $B_k$ (k is any one of 1 to n), an open circuit voltage $V_k(Q)$ of the cell block $B_k$ where the charge amount $Q_k$ is a variable, an internal resistance $R_k$ including the wiring of the cell block $B_k$, and a current $i_k$ flowing through the cell block $B_k$ are defined. In the model shown in FIG. 2, the following formulas (1) and (2) are satisfied. The charge amount Q is represented relative to a state of charge (SOC) 0% as a reference (zero). The unit of the charge amount Q is, for example, (mA·h), (A·h), or the like.

$$V_c = i_1 R_1 + V_1(Q_1 + i_1 dt) = \ldots = i_n R_n + V_n(Q_n + i_n dt) \quad (1)$$

$$I = \sum_{k=1}^{n} i_k \quad (2)$$

In formula (1), dt represents a minute time. When formula (1) and formula (2) are arranged using a primary approximation represented by the following formula (3), the following formulas (4) and (5) are satisfied.

$$V_k(Q_k + i_k dt) = V_k(Q_k) + V'_k(Q_k) i_k dt \quad (3)$$

$$\begin{bmatrix} A_1 & -A_2 & 0 & \ldots & 0 \\ 0 & A_2 & -A_3 & \ldots & 0 \\ 0 & 0 & A_3 & \ldots & 0 \\ \vdots & \vdots & \vdots & \ddots & \vdots \\ 0 & 0 & 0 & \ldots & -A_n \\ 1 & 1 & 1 & 1 & 1 \end{bmatrix} \begin{bmatrix} i_1 \\ i_2 \\ i_3 \\ \vdots \\ i_n \end{bmatrix} = \begin{bmatrix} -V_1(Q_1) + V_2(Q_2) \\ -V_2(Q_2) + V_3(Q_3) \\ -V_3(Q_3) + V_4(Q_4) \\ \vdots \\ -V_{n-1}(Q_{n-1}) + V_n(Q_n) \\ I \end{bmatrix} \quad (4)$$

$$A_k = (R_k + V'_k(Q_k) dt) \quad (5)$$

Thus, currents $i_1$ to $i_n$ of the cell blocks $B_1$ to $B_n$ can be calculated by using internal resistances $R_1$ to $R_n$, open circuit voltages $V_1(Q_1)$ to $V_n(Q_n)$, and primary differential values $V_1'(Q)$ to $V_n'(Q_n)$ at the charge amount Q of the open circuit voltages $V_1(Q_1)$ to $V_n(Q_n)$. Furthermore, in each of the cell blocks $B_1$ to $B_n$, namely, in the cell block $B_k$, the current load $P_k$ is defined by the following formula (6).

$$P_k = \frac{i_k}{F_k} \quad (6)$$

The parameter $F_k$ may be either of a capacity (cell block capacity) such as a charge capacity (full charge capacity) or a discharge capacity of the cell block $B_k$, and a positive electrode capacity or a negative electrode capacity of the cell block $B_k$; that is, the parameter representing the internal state of the cell block $B_k$ is used. The charge capacity (full charge capacity) is a charge amount of the cell block $B_k$ from the state of the SOC 0% to the state of the SOC 100%. The discharge capacity is a discharge amount of the cell block $B_k$ from the state of the SOC 100% to the state of the SOC 0%. In the cell block $B_k$, the state in which the voltage across a positive electrode terminal and a negative electrode terminal is $V_{\alpha 1}$ is defined as the state of the SOC 0%, and the state in which the voltage across the positive electrode terminal and the negative electrode terminal is $V_{\alpha 2}$ greater than $V_{\alpha 1}$ is defined as the state of the SOC 100%.

The positive electrode capacity is the charge amount of the cell block $B_k$ when the charge amount of the positive electrode is increased from an initial charge amount to an upper limit charge amount. The charge amount of the positive electrode in a state in which the positive electrode potential is $V_{\beta 1}$ is defined as the initial charge amount. The charge amount of the positive electrode in a state in which the positive electrode potential is $V_{\beta 2}$, which is higher than $V_{\beta 1}$, is defined as the upper limit charge amount. The negative electrode capacity is the charge amount of the cell block $B_k$ when the charge amount of the negative electrode is increased from an initial charge amount to an upper limit charge amount. The charge amount of the negative electrode in a state in which the negative electrode potential is $V_{\gamma 1}$ is defined as the initial charge amount. The charge amount of the negative electrode in a state in which the negative electrode potential is $V_{\gamma 2}$, which is lower than $V_{\gamma 1}$, is defined as the upper limit charge amount.

In formula (6), when the charge capacity (full charge capacity) of the cell block $B_k$ is used as the parameter $F_k$, the current load $P_k$ substantially corresponds to a charge rate of the cell block $B_k$ and becomes a value corresponding to the charge capacity (full charge capacity). If the aforementioned discharge capacity is used instead of the charge capacity as the parameter $F_k$, the current load $P_k$ substantially corresponds to a discharge rate of the cell block $B_k$ and becomes a value corresponding to the discharge capacity.

In the following, explanations will be given for a case in which the battery module 2 includes two cell blocks $B_1$ and $B_2$, namely, n=2. In the model of the cell blocks $B_1$ and $B_2$, the following formula (7) is satisfied from a relationship similar to formula (1).

$$i_1 R_1 + V_1(Q_1 + i_1 dt) = i_2 R_2 + V_2(Q_2 + i_2 dt) \quad (7)$$

When formula (7) is arranged using the primary approximation represented by formula (3), the following formula (8) is satisfied.

$$i_1(R_1 + V_1'(Q_1)dt) - i_2(R_2 + V_2'(Q_2)dt) = V_2(Q_2) - V_1(Q_1) \quad (8)$$

When $i_2 = I - i_1$ is substituted into formula (8), formula (9) is satisfied.

$$i_1(R_1 + V_1'(Q_1)dt + R_2 + V_2'(Q_2')dt) = V_2(Q_2) - V_1(Q_1) + I(R_2 + V_2'(Q_2)dt) \quad (9)$$

It is assumed that dt is a minute time. Accordingly, $V_1'(Q_1)dt$ is approximated to a value that is negligible relative to $R_1$ and $V_2'(Q_2)dt$ is approximated to a value that is negligible relative to $R_2$. Therefore, the following formula (10) is satisfied.

$$i_1(R_1 + R_2) = V_2(Q_2) - V_1(Q_1) + IR_2 \quad (10)$$

When $i_1 = I - i_2$ is substituted into formula (8) in the same manner as in the case where $i_2 = I - i_1$ is substituted into formula (8), the following formula (11) is satisfied.

$$i_2(R_1 + R_2) = -V_2(Q_2) + V_1(Q_1) + IR_1 \quad (11)$$

By subtracting formula (11) from formula (10), a difference between the current $i_1$ flowing through the cell block $B_1$ and the current $i_2$ flowing through the cell block $B_2$ is calculated as expressed by formula (12).

$$i_1 - i_2 = \frac{2(V_2(Q_2) - V_1(Q_1)) + I(R_2 - R_1)}{(R_1 + R_2)} \quad (12)$$

The value of $V_2(Q_2) - V_1(Q_1)$ in the numerator of formula (12) corresponds to a difference between the open circuit voltage of the cell block $B_1$ and the open circuit voltage of the cell block $B_2$. It is assumed that the cell blocks $B_1$ and $B_2$ are cell blocks (batteries) of the same type. It is also assumed that even if the capacities of the cell blocks $B_1$ and $B_2$ differ from each other due to deterioration, the open circuit voltage characteristics (the relation of the open circuit voltage to the charge amount or the SOC) do not substantially vary between the cell blocks $B_1$ and $B_2$. In this case, when the full charge capacity (charge capacity) $FCC_1$ of the cell block $B_1$ and the full charge capacity (charge capacity) $FCC_2$ of the cell block $B_2$, and the open circuit voltage characteristic V of the cell blocks $B_1$ and $B_2$ represented as a function, are defined, formula (13) is satisfied. The open circuit voltage characteristic V is open circuit voltage characteristics of the cell blocks $B_1$ and $B_2$, which are assumed not to substantially vary between the cell blocks $B_1$ and $B_2$.

$$V_1(Q_1) = V\left(\frac{Q_1}{FCC_1}\right), \quad V_2(Q_2) = V\left(\frac{Q_2}{FCC_2}\right) \quad (13)$$

When formula (13) is substituted into formula (12), the following formula (14) is satisfied.

$$i_1 - i_2 = \frac{2\left(V\left(\frac{Q_2}{FCC_2}\right) - V\left(\frac{Q_1}{FCC_1}\right)\right) + I(R_2 - R_1)}{(R_1 + R_2)} \quad (14)$$

When the following formula (15) is assumed and formula (15) is substituted into formula (14), the following formula (16) is satisfied.

$$\frac{Q_2}{FCC_2} = \frac{Q_1}{FCC_1} + dQ \quad (15)$$

$$i_1 - i_2 = \frac{2\left(V\left(\frac{Q_1}{FCC_1} + dQ\right) - V\left(\frac{Q_1}{FCC_1}\right)\right) + I(R_2 - R_1)}{(R_1 + R_2)} \quad (16)$$

If the current I and the internal resistances $R_1$ and $R_2$ do not substantially vary, the numerator of formula (16) changes in accordance with the magnitude of the inclination of the open circuit voltage characteristic V, and changes in accordance with the magnitude of the inclination of the voltage relative to the charge amount in each of the cell blocks $B_1$ and $B_2$. Furthermore, the numerator of formula (16) becomes greater as the inclination of the open circuit voltage characteristic V becomes greater.

If the charge current or the discharge current flowing through the battery module 2 is fixed and the inclination of the open circuit voltage characteristic V is fixed, the difference $(i_1-i_2)$ between the currents $i_1$ and $i_2$ does not vary. Therefore, in each of the cell blocks $B_1$ and $B_2$, a current corresponding to the capacity, such as the full charge capacity (charge capacity), flows. On the other hand, if the inclination of the open circuit voltage characteristic V varies considerably, the difference $(i_1-i_2)$ between the currents $i_1$ and $i_2$ varies considerably. In other words, in a range in which the inclination of the voltage relative to the charge amount in the open circuit voltage characteristic V in each of the cell blocks $B_1$ and $B_2$ is large, the current flowing through each of the cell blocks $B_1$ and $B_2$ may vary considerably. Therefore, a large current may flow in one of the cell blocks $B_1$ and $B_2$, and the current load of one of the cell blocks $B_1$ and $B_2$ may increase.

In a state where no current flows through the battery module 2, the voltage characteristic of the battery module 2 (the relation of the voltage to the charge amount or the SOC) is assumed to be the same as the open circuit voltage characteristic (the relation of the open circuit voltage to the charge amount or the SOC) of each of the cell blocks $B_1$ to $B_n$. As described above, in the range in which the inclination of the voltage relative to the charge amount in the open circuit voltage characteristic V of each of the cell blocks $B_1$ to $B_n$ varies considerably, the current flowing through each of the cell blocks $B_1$ to $B_n$ may vary considerably. Therefore, in the range in which the inclination of the voltage relative to the charge amount in the open circuit voltage characteristic V of the battery module 2 varies considerably, the current flowing through each of the cell blocks $B_1$ to $B_n$ may vary considerably. That is, in a range in which a second derivative value at the charge amount of the open circuit voltage of the battery module 2 is large, the current flowing through each of the cell blocks $B_1$ to $B_n$ may vary considerably.

With a model of the battery module 2 including the two cell blocks $B_1$ and $B_2$ that are different from each other in capacity and the internal resistance, calculation was actually performed. In the model used in the calculation, the capacity, such as the charge capacity, is smaller and the internal resistance is higher in the cell block $B_1$ than in the cell block $B_2$. Thus, the degree of deterioration in the cell block $B_1$ is higher than in the cell block $B_2$. As a result, the relation of the open circuit voltage $V_1$ relative to the SOC (open circuit voltage characteristic) in the cell block $B_1$ is set as indicated by the solid line in FIG. 3A. The relation of the open circuit voltage $V_2$ relative to the SOC (open circuit voltage characteristic) in the cell block $B_2$ is set as indicated by the broken line in FIG. 3A. Furthermore, by adjusting the current I flowing through the battery module 2, the relation of the voltage $V_c$ relative to the SOC (voltage characteristic) in the battery module 2 is set as indicated by the dot chain line in FIG. 3A. In FIG. 3A, the abscissa line represents the SOC and the ordinate line represents the voltage.

In the calculation, if the open circuit voltages $V_1$ and $V_2$ and the voltage $V_c$ were set as described above, the current $i_1$ flowing through the cell block $B_1$ and the current $i_2$ flowing through the cell block $B_2$ were calculated. In addition, the current load $P_1$ of the cell block $B_1$ and the current load $P_2$ of the cell block $B_2$ were calculated. Then, the relationship between the SOC and each of the currents $i_1$ and $i_2$ were calculated as shown in FIG. 3B, and the relationship between the SOC and each of the current loads $P_1$ and $P_2$ was calculated as shown in FIG. 3C. As the parameter $F_k$ for use in calculation of the current load $P_k$ (k is either 1 or 2), the charge capacity (the charge capacity of the SOC 0% to 100%) was used. In FIG. 3B, the abscissa axis represents the SOC and the ordinate axis represents the current. In FIG. 3B, a change in the current $i_1$ relative to the SOC is indicated by the solid line, and a change in the current $i_2$ relative to the SOC is indicated by the broken line. In FIG. 3C, the abscissa axis represents the SOC and the ordinate axis represents the current load. In FIG. 3C, a change in the current load $P_1$ relative to the SOC is indicated by the solid line, and a change in the current load $P_2$ relative to the SOC is indicated by the broken line.

As shown in FIG. 3A to FIG. 3C, if the SOC was at or around 70% and the SOC was at 90% or higher as a result of the calculation, the difference between the open circuit voltages $V_1$ and $V_2$ was large. If the SOC was either of at or around 70% and at 90% or higher, namely, if the SOC was within a predetermined range in which the difference between the open circuit voltages $V_1$ and $V_1$ was large, the currents $i_1$ and $i_2$ varied considerably. Therefore, if the SOC was within the predetermined range mentioned above, the current $i_1$ of the cell block $B_1$ having a smaller capacity and higher degree of deterioration became excessively large. On the other hand, if the SOC was out of the predetermined range mentioned above, namely, in most parts other than the predetermined range between the SOC 0% and the SOC 100%, the current $i_1$ of the cell block $B_1$ having a smaller capacity was smaller than the current $i_2$ of the block $B_2$.

If the SOC was out of the predetermined range mentioned above, namely, in most parts other than the predetermined range between the SOC 0% and the SOC 100%, the current load $P_1$ of the cell block $B_1$ was smaller than the current load $P_2$ of the cell block $B_2$, or there was substantially no difference between the current loads $P_1$ and $P_2$. On the other hand, if the SOC was either of at or around 70% and at 90% or higher, namely, if the SOC was within the predetermined range mentioned above, the current load $P_1$ of the cell block $B_1$ having a high degree of deterioration became excessively large, and variations of the current loads $P_1$ and $P_2$ become excessively large.

In this embodiment, the controller 12 controls charging and discharging of the battery module 2 based on the relationship of the current loads $P_1$ to $P_n$ of the cell blocks $B_1$ to $B_n$ relative to the SOC of the battery module 2. Then, the processor of the controller 12 acquires information indicative of the relationship of the current loads $P_1$ to $P_n$ of the cell blocks $B_1$ to $B_n$ relative to the SOC from the storage medium of the controller 12, or from a server connected to the controller 12 through a network. The information indicative of the relationship of the current loads $P_1$ to $P_n$ of the cell blocks $B_1$ to $B_n$ relative to the SOC of the battery module 2 includes a range of the SOC of the battery module 2 in which the current load (any of $P_1$ to $P_n$) is liable to be high in a cell block (any of $B_1$ to $B_n$) having a high degree of deterioration, namely, a range of the SOC of the battery module 2 in which the current loads $P_1$ to $P_n$ of the cell blocks $B_1$ to $B_n$ are liable to vary widely.

The controller 12 acquires the range of the SOC of the battery module 2 in which the current loads $P_1$ to $P_n$ of the cell blocks $B_1$ to $B_n$ are liable to vary widely as the predetermined range of the SOC of the battery module 2. Then, in each of the charge and the discharge of the battery module 2, if the SOC of the battery module 2 in real time is within the predetermined range mentioned above, the controller 12 suppresses the current I flowing through the battery module 2. Since the predetermined range of the SOC of the battery module 2 is the range of the SOC of the battery module 2 in which the current loads $P_1$ to $P_n$ of the cell blocks $B_1$ to $B_n$ are liable to vary widely, it corresponds to a range in which the inclination of the voltage relative to the charge amount in the open circuit voltage characteristic V of each of the cell blocks $B_1$ to $B_n$ changes considerably. In other words, the predetermined range of the SOC of the battery module 2 corresponds to a range in which the second derivative value at the charge amount of the open circuit voltage in the open circuit voltage characteristic V of each of the cell blocks $B_1$ to $B_n$ is large. Therefore, the predetermined range of the SOC of the battery module 2 is set on the basis of the magnitude of a change in the inclination of the voltage relative to the charge amount in each of the cell blocks $B_1$ to $B_n$.

Figure 4:
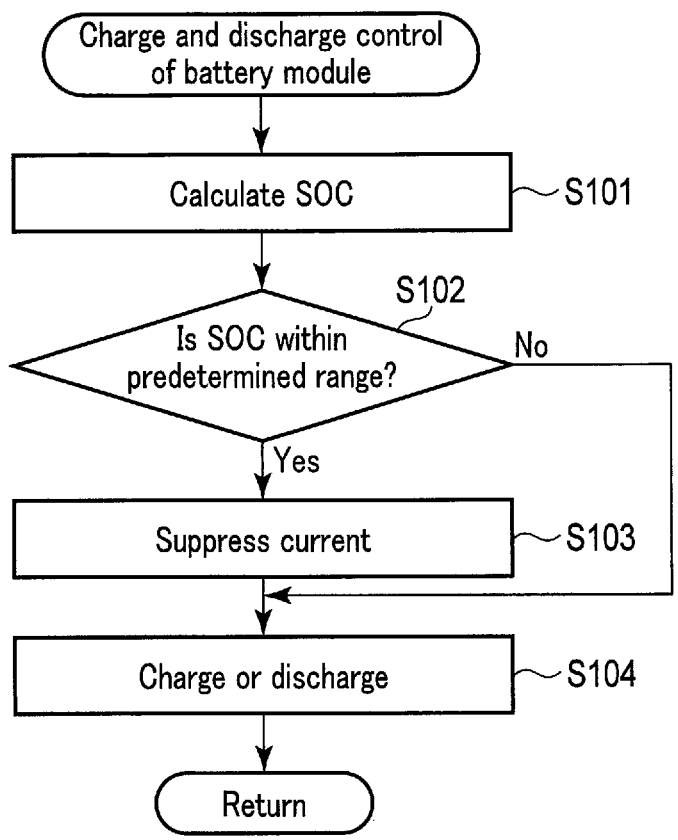
FIG. 4 is a flowchart showing processing performed in charge and discharge control of a battery module by a controller according to the first embodiment.

FIG. 4 shows processing performed by the controller 12 (the current load determination unit 13 and the charge and discharge control unit 15) in the charge and discharge control of the battery module 2. The processing shown in FIG. 4 is periodically performed at predetermined timings in each of the charge and the discharge of the assembled battery 2. As shown in FIG. 4, in each of the charge and the discharge of the battery module 2, the current load determination unit 13 estimates and calculates a real time SOC of the battery module 2 (S101). As a result, the SOC of the battery module 2 is acquired as a parameter relating to the current loads $P_1$ to $P_n$ of the cell blocks $B_1$ to $B_n$. The current load determination unit 13 calculates the SOC of the battery module 2 using measurement results of the current I and the voltage $V_c$. The method of calculating the SOC of the battery module 2 may be a current integration method, a calculation method using the relationship between the voltage $V_c$ and the SOC of the battery module 2, an estimation method using a Kalman filter, etc.

The current load determination unit 13 determines whether the calculated SOC of the battery module 2 is within the predetermined range of the SOC (S102). As described above, the predetermined range of the SOC corresponds to the range in which the inclination of the voltage relative to the charge amount in the open circuit voltage characteristic of the battery module 2 changes considerably. If the SOC of the battery module 2 is within the predetermined range, the current loads $P_1$ to $P_n$ of the cell blocks $B_1$ to $B_n$ are liable to vary widely.

In this embodiment, if the SOC of the battery module 2 is within the predetermined range, the current load determination unit 13 determines that the current loads $P_1$ to $P_n$ of the cell blocks $B_1$ to $B_n$ vary widely, namely, determines that the current loads $P_1$ to $P_n$ vary beyond a permissible range. On the other hand, if the SOC of the battery module 2 is out of the predetermined range, the current load determination unit 13 determines that variations of the current loads $P_1$ to $P_n$ of the cell blocks $B_1$ to $B_n$ are within the permissible range. In one example, if the SOC is either of at or around 70% and at 90% or higher, it is determined that the SOC of the battery module 2 is within the predetermined range.

If the SOC of the battery module 2 is within the predetermined range (S102—Yes), the charge and discharge control unit 15 suppresses the current I flowing through the battery module 2 (S103). The charge and discharge control unit 15 charges or discharges the battery module 2 under conditions in which the current I is suppressed (S104). On the other hand, if the SOC of the battery module 2 is out of the predetermined range (S102—No), the charge and discharge control unit 15 charges or discharges the battery module 2 without suppressing the current I (S104). Thus, based on the fact that the SOC of the battery module 2 is within the predetermined range, the charge and discharge control unit 15 suppresses the current I flowing through the battery module 2 as compared to the case in which the SOC of the battery module 2 is out of the predetermined range.

In this embodiment, the processing as described above is performed. Therefore, if the SOC of the battery module 2 enters the range in which the current load (any of $P_1$ to $P_n$) is liable to be high in the cell block (any of $B_1$ to $B_n$) having a high degree of deterioration, the current I flowing through the battery module 2 is suppressed. In other words, if the SOC of the battery module 2 enters the range in which the current loads $P_1$ to $P_n$ of the cell blocks $B_1$ to $B_n$ are liable to vary widely, the current I flowing through the battery module 2 is suppressed. Therefore, even if the SOC of the battery module 2 is within the predetermined range mentioned above, the current loads $P_1$ to $P_n$ are prevented from excessively varying between the cell blocks $B_1$ to $B_n$. In addition, even if the cell blocks $B_1$ to $B_n$ vary in performance such as in the degree of deterioration, the current load (any of $P_1$ to $P_n$) of the cell block (any of $B_1$ to $B_n$) having a high degree of deterioration cannot be excessively high. Therefore, the increase in variations of deterioration between the cell blocks $B_1$ to $B_n$ is suppressed.

Second Embodiment

Figure 5:
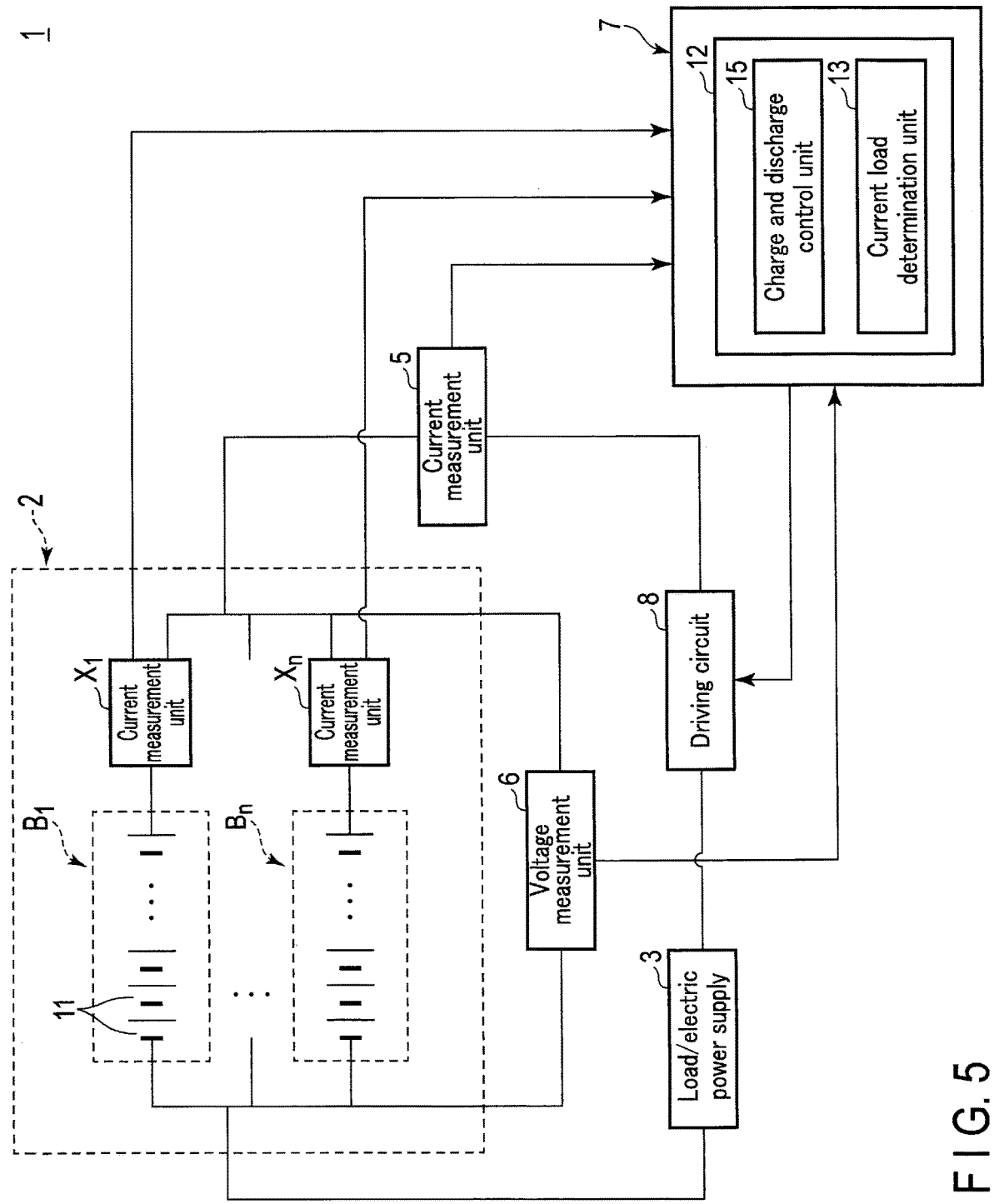
FIG. 5 is a schematic diagram showing a charge and discharge system according to a second embodiment.

FIG. 5 shows a charge and discharge system 1 according to the second embodiment. In the following, explanations of elements similar to those of the first embodiment will be omitted. As shown in FIG. 5, in the present embodiment, the battery module 2 includes a plurality of current measurement units (current measurement circuits) $X_1$ to $X_n$. The current measurement units $X_1$ to $X_n$ are electrically parallel to one another. A current measurement unit $X_k$ (k is any one of 1 to n) is electrically connected to a cell block $B_k$ in series, and detects and measures a current $i_k$ flowing through the cell block $B_k$. The controller 12 periodically acquires the measurement value of the currents $i_1$ to $i_n$ at predetermined timings. Accordingly, the change with time (time history) of each of the currents $i_1$ to $i_n$ is acquired by the controller 12.

In the present embodiment, the controller 12 integrates the current $i_k$ flowing through the cell block $B_k$, so that it can estimate the SOC of the cell block $B_k$ and can also calculate a charge amount of the cell block $B_k$ from the state of the SOC 0%. Thus, the controller 12 can estimate the SOC and the charge amount of each of the cell blocks $B_1$ to $B_n$.

Furthermore, the current load determination unit 13 of the controller 12 estimates a parameter representing the internal state of the cell block $B_k$ based on a measurement value and a change with time of the current $i_k$, an estimation value of the charge amount of the cell block $B_k$, and a measurement value and a change with time of the voltage $V_c$ of the battery module 2. At this time, as the parameter representing the internal state of the cell block $B_k$, either of a capacity (cell block capacity), such as charge capacity (full charge capacity) or a discharge capacity of the cell block $B_k$, and a positive electrode capacity or a negative electrode capacity of the cell block $B_k$ is estimated. In one example, in the same manner as described in Reference Document 1 (Jpn. Pat. Appln. KOKAI Publication No. 2012-251806), the parameter representing the internal state of the cell block $B_k$ is estimated. Accordingly, in the present embodiment, the parameter representing the internal state of each of the cell blocks $B_1$ to $B_k$ is estimated by the controller 12.

Furthermore, in the present embodiment, since the parameter representing the internal state of each of the cell blocks $B_1$ to $B_k$ is estimated as described above, the controller 12 can estimate a degree of deterioration of each of the cell blocks $B_1$ to $B_k$ based on the estimated parameter. In one example, the current load determination unit 13 of the controller 12 determines that the degree of deterioration of the cell blocks $B_1$ to $B_k$ becomes higher as the estimated charge capacity (full charge capacity) becomes smaller. Even by using the positive electrode capacity and the negative electrode capacity instead of the capacity such as the charge capacity, the degree of deterioration can be determined by the controller 12 in the same manner.

In the present embodiment, the current load determination unit 13 calculates a current load $P_k$ of the cell block $B_k$. At this time, the measurement value of the current $i_k$ is used and the parameter representing the internal state of the cell block $B_k$ is used as the parameter $F_k$. Then, the current load $P_k$ is calculated as formula (6) described above. Thus, in the present embodiment, the current load determination unit 13 calculates the current loads $P_1$ to $P_n$ of the cell blocks $B_1$ to $B_n$. In each of the charge and the discharge of the battery module 2, the charge and discharge control unit 15 of the controller 12 controls the current I flowing through the battery module 2 and controls the current flowing through each of the cell blocks $B_1$ to $B_n$ based on the calculated current loads $P_1$ to $P_n$. Thus, the currents $i_1$ to $i_n$ are controlled based on the calculated current loads $P_1$ to $P_n$.

Figure 6:
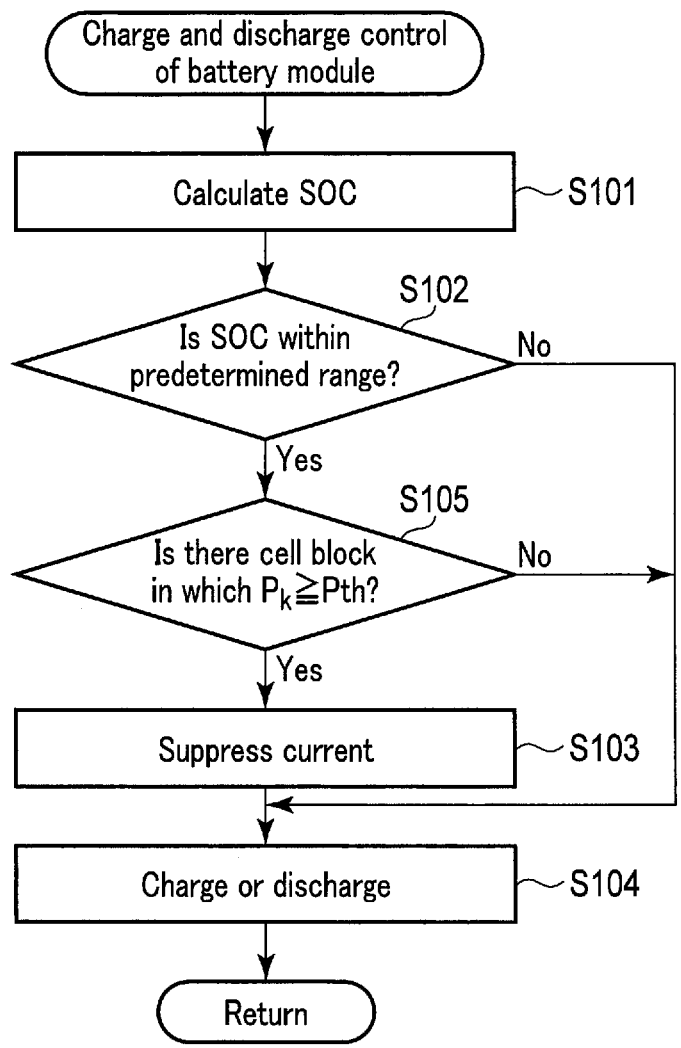
FIG. 6 is a flowchart showing processing performed in charge and discharge control of a battery module by a controller according to the second embodiment.

FIG. 6 shows processing performed in charge and discharge control of the battery module 2 by the controller 12 (the current load determination unit 13 and the charge and discharge control unit 15) according to the present embodiment. In this embodiment, as well as the first embodiment, the current load determination unit 13 performs the processing of S101 and S102. However, in this embodiment, the current load determination unit 13 calculates the current loads $P_1$ to $P_n$ of the cell blocks $B_1$ to $B_n$ from the measurement values of the currents $i_1$ to $i_n$ in the manner described above. If the SOC of the battery module 2 is within the predetermined range (S102—Yes), the current determination unit 13 determines whether there is a cell block in which the current load $P_k$ is equal to or greater than a threshold Pth (S105).

If there is a cell block in which the current load $P_k$ is equal to or greater than a threshold Pth, namely, if any one of the current loads $P_1$ to $P_n$ of the cell blocks $B_1$ to $B_n$ is equal to or greater than the threshold Pth (S105—Yes), the charge and discharge control unit 15 suppresses the current I flowing through the battery module 2 (S103). The charge and discharge control unit 15 charges or discharges the battery module 2 under conditions in which the current I is suppressed (S104). On the other hand, if all of the current loads $P_1$ to $P_n$ of the cell blocks $B_1$ to $B_n$ are smaller than the threshold Pth (S105—No), the charge and discharge control unit 15 charges or discharges the battery module 2 without suppressing the current I flowing through the battery module 2 (S104). The threshold value Pth is, for example, an upper limit of the permissible range of the current load, and stored in a storage medium of the controller 12, or a storage medium of a server connected to the controller 12 through a network.

As described above, according to the present embodiment, based on the fact that the SOC of the battery module 2 is within the predetermined range and that the current load of some of the cell blocks $B_1$ to $B_n$ is equal to or greater than the threshold value Pth, the current I flowing through the battery module 2 is suppressed. Thus, the current flowing through each of the cell blocks $B_1$ to $B_n$ is controlled based on the calculated current loads $P_1$ to $P_n$. Furthermore, according to the present embodiment, based on the fact that the current load is equal to or greater than the threshold value Pth in some of the cell blocks $B_1$ to $B_n$, the current flowing through the battery module 2 is suppressed as compared to the case in which the current load is smaller than the threshold value Pth in all of the cell blocks $B_1$ to $B_n$. Thus, the current loads $P_1$ to $P_n$ of the cell blocks $B_1$ to $B_n$ are calculated more appropriately and the current I is controlled more appropriately based on the current loads $P_1$ to $P_n$.

(Modifications of Second Embodiment)

In one modification of the second embodiment, the processing of S101 and S102 is not performed, and determination based on the SOC of the battery module 2 is not performed. However, in this modification, the determination of S105 based on the current loads $P_1$ to $P_n$ of the cell blocks $B_1$ to $B_n$ is performed by the current load determination unit 13 in the same manner as in the second embodiment. Also in this modification, if any one of the current loads $P_1$ to $P_n$ of the cell blocks $B_1$ to $B_n$ is equal to or greater than the threshold Pth (S105—Yes), the charge and discharge control unit 15 suppresses the current I flowing through the battery module 2 (S103). The charge and discharge control unit 15 charges or discharges the battery module 2 under conditions in which the current I is suppressed (S104). On the other hand, if all of the current loads $P_1$ to $P_n$ of the cell blocks $B_1$ to $B_n$ are smaller than the threshold Pth (S105—No), the charge and discharge control unit 15 charges or discharges the battery module 2 without suppressing the current I (S104).

In another modification of the second embodiment, the following processing may be performed instead of comparing each of the current loads $P_1$ to $P_n$ with the threshold value Pth in S105. In this modification, the current load determination unit 13 of the controller 12 determines a degree of deterioration of each of the cell blocks $B_1$ to $B_n$ based on either the full charge capacity or the positive electrode capacity and the negative electrode capacity. Here, a cell block $B_\varepsilon$ having the highest degree of deterioration of all cell blocks $B_1$ to $B_n$ is defined. In this modification, instead of the determination of S105, the current load determination section 13 compares the current load $P_\varepsilon$ of the cell block $B_\varepsilon$ with the current load of each of the cell blocks other than the cell block $B_\varepsilon$.

If the current load $P_\varepsilon$ of the cell block $B_\varepsilon$ is equal to or greater than the current load of any of the cell blocks other than the cell block $B_\varepsilon$, the charge and discharge control unit 15 suppresses the current I flowing through the battery module 2. The charge and discharge control unit 15 charges or discharges the battery module 2 under conditions in which the current I is suppressed. On the other hand, if the current load $P_\varepsilon$ of the cell block $B_\varepsilon$ is smaller than all of the current loads of the cell blocks other than the cell block $B_\varepsilon$, the charge and discharge control unit 15 charges or discharges the battery module 2 without suppressing the current I flowing through the battery module 2.

It is assumed that the battery module 2 includes two cell blocks $B_1$ and $B_2$ (n=2), and the degree of deterioration of the cell block $B_1$ is higher than that of the cell block $B_2$. In this case, according to the present modification, the current load determination unit 13 compared the current loads $P_1$ and $P_2$. If the current load $P_1$ is equal to or greater than the current load $P_2$, the charge and discharge control unit 15 suppresses the current I flowing through the battery module 2. The charge and discharge control unit 15 charges or discharges the battery module 2 under conditions in which the current I is suppressed. On the other hand, if the current load $P_1$ is smaller than the current load $P_2$, the charge and discharge control unit 15 charges or discharges the battery module 2 without suppressing the current I flowing through the battery module 2.

Also in this modification, the current flowing through each of the cell blocks $B_1$ to $B_n$ is controlled based on the calculated current loads $P_1$ to $P_n$ in the same manner as in the second embodiment etc. Therefore, the present modification produces the same effects and advantages as those of the second embodiment etc.

Third Embodiment

Figure 7:
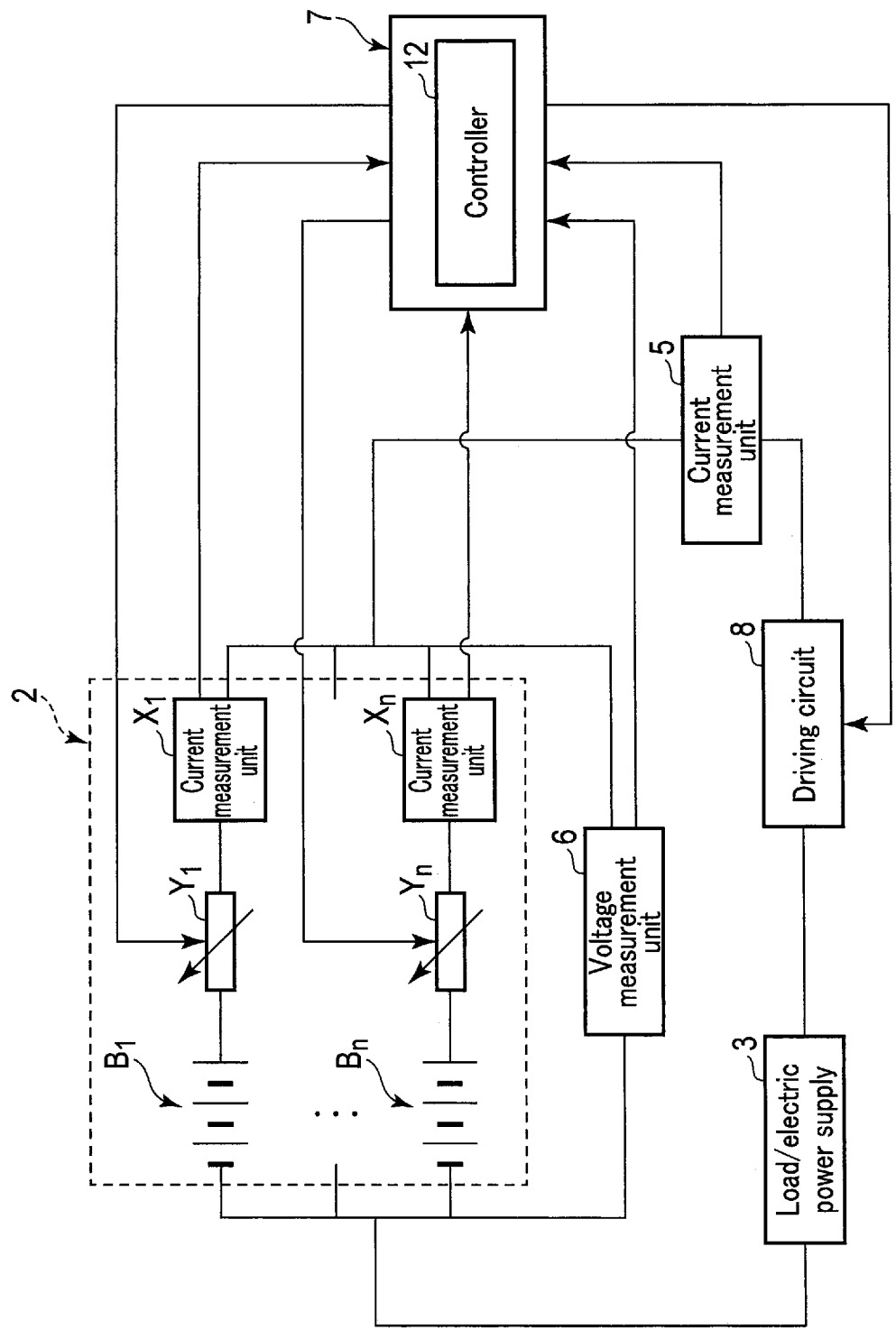
FIG. 7 is a schematic diagram showing a charge and discharge system according to a third embodiment.

FIG. 7 shows a charge and discharge system 1 according to the third embodiment. In the following, explanations of elements similar to those of the second embodiment will be omitted. Also in this embodiment, current measurement units (current measurement circuits) $X_1$ to $X_n$ are provided. The controller 12 acquires measurement values of currents $i_1$ to $i_n$ and a change with time (time history) of each of the currents $i_1$ to $i_n$. Then, the current load determination unit 13 calculates the current loads $P_1$ to $P_n$ of the cell blocks $B_1$ to $B_n$ in the same manner as in the second embodiment.

In this embodiment, variable resistors $Y_1$ to $Y_n$ are provided. The variable resistors $Y_1$ to $Y_n$ are electrically parallel to one another. The variable resistors $Y_k$ (k is any one of 1 to n) are electrically connected to the cell block $B_k$ in series. Thus, each of the variable resistors $Y_1$ to $Y_n$ is connected in series to the corresponding one of the cell blocks $B_1$ to $B_n$. In this embodiment, in the same manner as in the second embodiment, the charge and discharge control unit 15 of the controller 12 controls driving of the driving circuit 8, thereby controlling the current I flowing through the battery module 2. Furthermore, in this embodiment, the charge and discharge control unit 15 is configured to adjust resistance values $r_1$ to $r_n$ of the variable resistors $Y_1$ to $Y_n$. The charge and discharge control unit 15 controls currents $i_1$ to $i_n$ by adjusting the resistance values $r_1$ to $r_n$.

Figure 8:
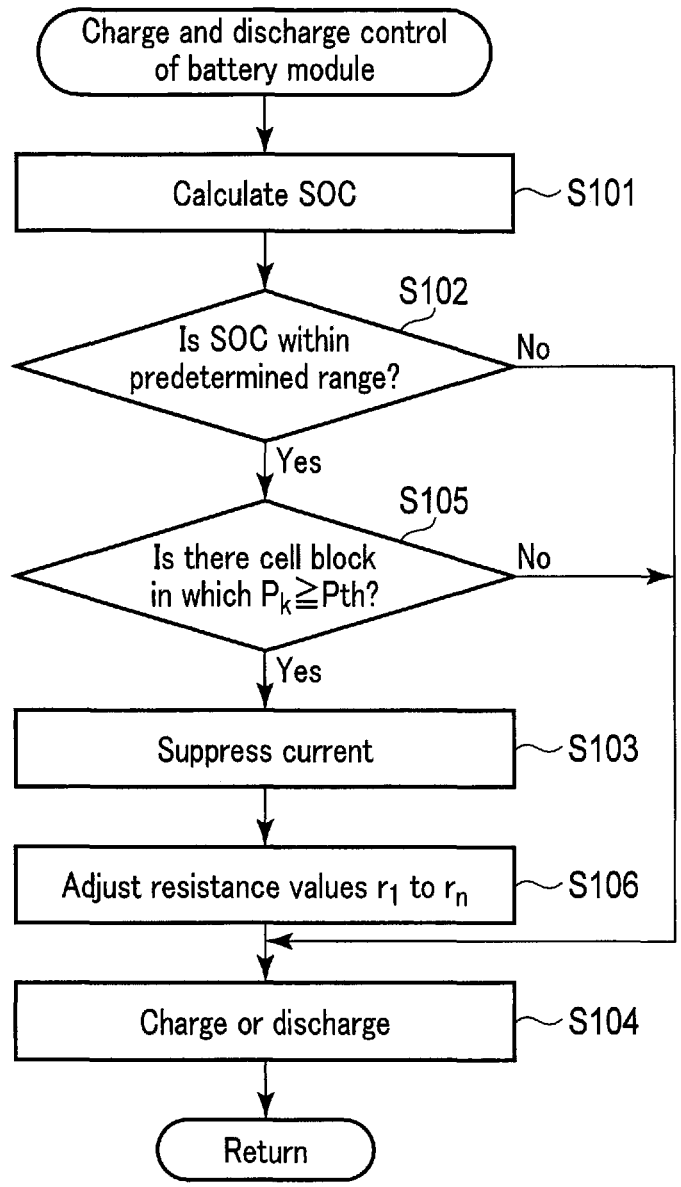
FIG. 8 is a flowchart showing processing performed in charge and discharge control of a battery module by a controller according to the third embodiment.

FIG. 8 shows processing performed in charge and discharge control of the battery module 2 by the controller 12 (the current load determination unit 13 and the charge and discharge control unit 15) of the present embodiment. Also in this embodiment, in the same manner as in the second embodiment, the current load determination unit 13 performs the processing of S101, S102, and S105. If some of the current loads $P_1$ to $P_n$ of the cell blocks $B_1$ to $B_n$ is equal to or greater than the threshold value Pth (S105—Yes), the charge and discharge control unit 15 suppresses the current I flowing through the battery module 2 (S103).

If some of the current loads $P_1$ to $P_n$ of the cell blocks $B_1$ to $B_n$ is equal to or greater than the threshold value Pth (S105—Yes), the charge and discharge control unit 15 adjusts the resistance values $r_1$ to $r_n$ of the variable resistors $Y_1$ to $Y_n$ based on the current loads $P_1$ to $P_n$ of the cell blocks $B_1$ to $B_n$ (S106). Then, the charge and discharge control unit 15 charges and discharges the battery module 2 under conditions in which the current I is suppressed and the resistance values $r_1$ to $r_n$ are adjusted (S104). On the other hand, if all of the current loads $P_1$ to $P_n$ of the cell blocks $B_1$ to $B_n$ are smaller than the threshold value Pth (S105—No), the charge and discharge control unit 15 charges or discharges the battery module 2 without either suppressing the current I flowing through the battery module 2 or adjusting the resistance values $r_1$ to $r_n$ (S104).

In one example, the controller 12 adjusts the resistance values $r_1$ to $r_n$ of the variable resistors $Y_1$ to $Y_n$ in accordance with the magnitudes of the calculated current loads $P_1$ to $P_n$. In this case, a variable resistor connected in series to a cell block having a large current load is set to a high resistance value, whereas a variable resistor connected in series to a cell block having a small current load is set to a low resistance value. As a result, an excessively large current is prevented from flowing through the cell block having a large current load. Thus, the resistance values $r_1$ to $r_n$ are adjusted such that the variations of the current loads $P_1$ to $P_n$ are reduced.

In another example, the controller 12 calculates internal resistances $R_1$ to $R_n$ of the cell blocks $B_1$ to $B_n$ based on the currents $i_1$ to $i_n$. The internal resistance $R_k$ of the cell block $B_k$ is expressed as formula (17) using the current $i_k$. The charge and discharge control unit 15 performs a control so that the sum of the internal resistance $R_k$ and the resistance value $r_k$ of the variable resistor $Y_k$ is equal in all cell blocks. In other words, the resistance values $r_1$ to $r_n$ are adjusted to satisfy formula (18).

$$R_k = \frac{V_c(t+dt) - V_c(t)}{i_k(t+dt) - i_k(t)} \tag{17}$$

$$R_1 + r_1 = R_2 + r_2 = \ldots = R_n + r_n \tag{18}$$

By adjusting the resistance values $r_1$ to $r_n$ as described above, each of the currents $i_1$ to $i_n$ is controlled such that the variations of the currents $i_1$ to $i_n$ are reduced, namely, the currents $i_1$ to $i_n$ are the same or substantially the same as one another. Thus, the resistance values $r_1$ to $r_n$ are adjusted such that the variations of the current loads $P_1$ and $P_n$ are reduced. If the resistance values $r_1$ to $r_n$ are adjusted to satisfy formula (18), it is preferable that the resistance values $r_1$ to $r_n$ be adjusted such that the sum of the resistance values $r_1$ to $r_n$ of the variable resistors $Y_1$ to $Y_n$ are as small as possible. The method of calculating the internal resistance $R_k$ may be an estimation method using a Kalman filter, a calculation using a sequential least squares method, a calculation using Fourier transform, etc., in addition to the method using formula (17).

The present embodiment produces the same effects and advantages as those of the second embodiment etc. Furthermore, according to the present embodiment, it is not only the current I flowing through the battery module 2 that is adjustable, but also the currents $i_1$ to $i_n$ are adjustable by adjusting the resistance values $r_1$ to $r_n$ of the variable resistors $Y_1$ to $Y_n$.

(Modifications of Third Embodiment)

Also in the case of providing the variable resistors $Y_1$ to $Y_n$ as in the third embodiment, the processing by the controller 12 may be appropriately changed as in the modifications of the second embodiment described above.

In another modification, in the configuration in which the variable resistors $Y_1$ to $Y_n$ are provided as in the third embodiment, the processing of suppressing the current I in S103 may not be performed. In this modification, if some of the current loads $P_1$ to $P_n$ of the cell blocks $B_1$ to $B_n$ is equal to or greater than the threshold value Pth (S105—Yes), the charge and discharge control unit 15 only adjusts the resistance values $r_1$ to $r_n$ of the variable resistors $Y_1$ to $Y_n$ in S106. In this modification also, the resistance values $r_1$ to $r_n$ are adjusted in the same manner as in the third embodiment. Thus, the resistance values $r_1$ to $r_n$ are adjusted such that the variations of the current loads $P_1$ to $P_n$ are reduced.

In at least one of the embodiments or examples described above, the current flowing through each of the cell blocks is controlled based on at least one of the current loads or a parameter relating to the current loads. Accordingly, in the battery module in which cell blocks are connected in parallel, the current loads are prevented from being excessively greatly varied between the cell blocks.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A charge and discharge control method of controlling charging and discharging of a battery module in which a plurality of cell blocks, each including one or more unit cells, are connected in parallel to one another, the method comprising:
   calculating a ratio of a measurement value of a current relative to any one of a cell block capacity, a positive electrode capacitance and a negative electrode capacitance as a current load in regard to each of the cell blocks;
   suppressing an input current or an output current of the battery module, in which all of the cell blocks are connected in parallel, based on a fact that the calculated current load is equal to or greater than a threshold value in one or more of the cell blocks, as compared to a case in which the current load is smaller than the threshold value in all of the cell blocks; and
   charging the battery module by the suppressed input current or discharging the battery module by the suppressed output current, so as to change a state of charge (SOC) of the battery module.

2. A charge and discharge control device comprising a processor configured to perform the charge and discharge control method according to claim 1.

3. A non-transitory storage medium storing a charge and discharge control program, the program causing a computer to perform the charge and discharge control method according to claim 1.

* * * * *